United States Patent
Zheng et al.

(10) Patent No.: US 9,356,190 B2
(45) Date of Patent: *May 31, 2016

(54) GAN-BASED LED

(71) Applicant: XIAMEN SANAN OPTOELECTRONICS TECHNOLOGY CO., LTD., Xiamen (CN)

(72) Inventors: Jiansen Zheng, Xiamen (CN); Suhui Lin, Xiamen (CN); Kangwei Peng, Xiamen (CN); Lingyuan Hong, Xiamen (CN); Lingfeng Yin, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

This patent is subject to a terminal disclaimer.

(21) Appl. No.: 14/536,713

(22) Filed: Nov. 10, 2014

(65) Prior Publication Data

US 2015/0060880 A1 Mar. 5, 2015

Related U.S. Application Data

(63) Continuation of application No. PCT/CN2013/077609, filed on Jun. 21, 2013.

(30) Foreign Application Priority Data

Jun. 21, 2012 (CN) .......................... 2012 1 0206024

(51) Int. Cl.
 *H01L 33/10* (2010.01)
 *H01L 33/46* (2010.01)
 *H01L 33/32* (2010.01)
 *H01L 33/14* (2010.01)

(52) U.S. Cl.
 CPC ................. *H01L 33/10* (2013.01); *H01L 33/32* (2013.01); *H01L 33/46* (2013.01); *H01L 33/14* (2013.01)

(58) Field of Classification Search
 CPC ......... H01L 33/46; H01L 33/20; H01L 33/42; H01L 33/32; H01L 33/405; H01L 33/22; H01L 33/38; H01L 2933/0091; H01L 33/10; H01L 25/13; H01L 33/60; H01L 33/14
 See application file for complete search history.

(56) References Cited

U.S. PATENT DOCUMENTS 6,787,383 B2* 9/2004 Ikeda et al. .................... 438/44
9,006,768 B2* 4/2015 Pan ..................... H01L 33/0079
 257/98

(Continued)

*Primary Examiner* — Jarrett Stark
*Assistant Examiner* — Bitew Dinke
(74) *Attorney, Agent, or Firm* — Syncoda LLC; Feng Ma; Junjie Feng

(57) ABSTRACT

A GaN-based LED includes: a substrate with front and back sides; an epitaxial layer formed over the front side of the substrate and including, from top down, a P-type layer, a light-emitting area, and an N-type layer; a current spreading layer formed over the P-type layer; a P electrode formed over the current spreading layer; a first reflecting layer between the current spreading layer and the epitaxial layer, disposed at a peripheral area of the epitaxial layer in a band-shaped distribution; and a second reflecting layer over the back side the substrate. The band-shaped or annular distribution can increase a probability light extraction of the LED sideways. By controlling the ratio of lights extracted upwards and sideways, the light-emitting distribution evenness can be adjusted and the uneven heat dissipation can be improved.

20 Claims, 8 Drawing Sheets

(56) References Cited

U.S. PATENT DOCUMENTS

| | | | |
|---|---|---|---|
| 9,190,395 B2* | 11/2015 | Zheng | H01L 33/405 |
| 2002/0000563 A1* | 1/2002 | Udagawa | 257/94 |
| 2003/0052323 A1* | 3/2003 | Takeuchi et al. | 257/81 |
| 2004/0135166 A1* | 7/2004 | Yamada et al. | 257/103 |
| 2005/0087753 A1* | 4/2005 | D'Evelyn et al. | 257/98 |
| 2005/0104080 A1* | 5/2005 | Ichihara et al. | 257/98 |
| 2006/0033113 A1* | 2/2006 | Lee et al. | 257/80 |
| 2006/0163603 A1* | 7/2006 | Takeuchi | H01L 33/30 257/103 |
| 2007/0126022 A1* | 6/2007 | Baik | H01L 33/14 257/103 |
| 2008/0157115 A1* | 7/2008 | Chuang | H01L 33/10 257/99 |
| 2008/0303034 A1* | 12/2008 | Huang | H01L 33/46 257/76 |
| 2009/0278163 A1* | 11/2009 | Sakamoto et al. | 257/101 |
| 2010/0025713 A1* | 2/2010 | Tao et al. | 257/98 |
| 2010/0123118 A1* | 5/2010 | Hu et al. | 257/13 |
| 2010/0176413 A1* | 7/2010 | Lin et al. | 257/98 |
| 2010/0176419 A1* | 7/2010 | Lin et al. | 257/103 |
| 2010/0213493 A1* | 8/2010 | Hsu | H01L 33/22 257/98 |
| 2010/0320478 A1* | 12/2010 | Lin et al. | 257/79 |
| 2011/0049472 A1* | 3/2011 | Kim et al. | 257/13 |
| 2011/0233589 A1* | 9/2011 | Kim et al. | 257/98 |
| 2012/0098009 A1* | 4/2012 | Kim et al. | 257/98 |
| 2012/0322176 A1* | 12/2012 | Yoo | 438/22 |
| 2013/0292731 A1* | 11/2013 | Chen et al. | 257/98 |
| 2014/0034985 A1* | 2/2014 | Pan et al. | 257/98 |

* cited by examiner

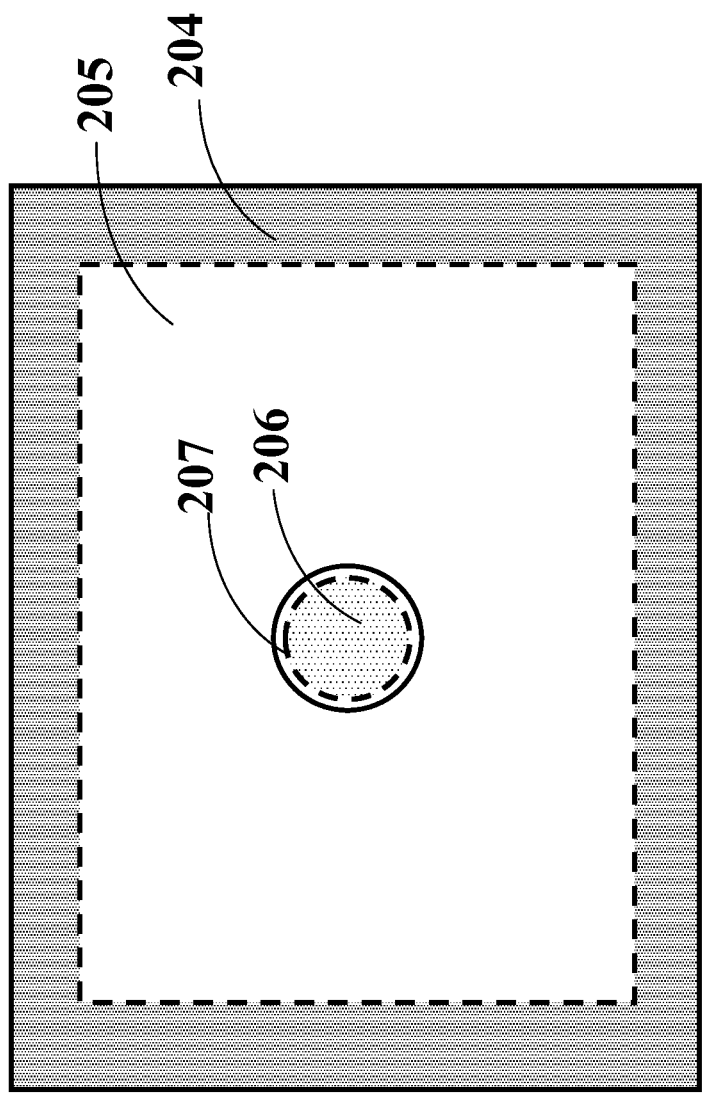

GAN-BASED LED

CROSS-REFERENCE TO RELATED APPLICATIONS

The present application is a continuation of, and claims priority to, PCT/CN2013/077609 filed on Jun. 21, 2013, which claims priority to Chinese Patent Application No. CN 201210206024.3 filed on Jun. 21, 2012. The disclosures of these applications are hereby incorporated by reference in their entirety.

BACKGROUND

Light Emitting Diode (LED) is a semiconductor light-emitting device fabricated by adopting P-N junction electroluminescence principle. LEDs have advantages such as being—polluting, high brightness, low power consumption, long service life, low working voltage, easy miniaturization, etc. Since its successful development in 1990s, the GaN-based LED gets luminance improved and has wider applications with continuous research and development. Much studies are made on improving LED light-emitting efficiency, mainly concerning such technologies as pattern substrate technology, distributed current blocking layer (i.e., current blocking layer), distributed Bragg reflector (DBR) structure, transparent substrate, surface roughening, photonic crystal technology, etc.

Referring to FIG. 1, a normal LED structure, comprising a substrate 100, a bottom-up-laminated N-type layer 101, a light-emitting area 102, a P-type layer 103, a current spreading layer 104, a P electrode 106, an N electrode 107 on the exposed surface of the N-type layer 101 and a back-plating reflecting layer 108 under the substrate 100. The light emitted from the light-emitting layer (as shown in 1a) can be extracted from the front side of the chip. Light 1b, however, due to total reflection, cannot be extracted from the front of the chip but from the side; Light 1c is directly extracted from the side; Lights 1d and 1e are extracted from the front side of the chip after reflection of the back-plating reflecting layer 108.

Referring to FIG. 2, an improved conventional LED structure, comprising a substrate 100, a bottom-up-laminated N-type layer 101, a light-emitting area 102, a P-type layer 103, a current spreading layer 104, a metal reflecting layer 105, a P electrode 106, an N electrode 107 on the exposed surface of the N-type layer 101 and a back-plating reflecting layer 108 under the substrate 100. The light emitted from the light-emitting layer (as shown in 1a) can be extracted from the front side of the chip. Light 1b, however, due to total reflection, cannot be extracted from the front of the chip but from the side; Light 1c is directly extracted from the side; Lights 1d and 1e are extracted from the front side of the chip after reflection of the back-plating reflecting layer 108; light 1f, due to the dual reflection of the metal reflecting layer 105 (normally, Al or Ag) and the back-plating reflecting layer 108 (normally, Al, Ag or DBR), is finally extracted from the front side of the chip. In the above two normal LED structures, most light from the light-emitting layer is extracted from the front of the chip and less from the side of the chip, leading to uneven light distribution of LED, over strong light emitting at axial direction at front side, uneven heat dissipation and small light emitting angle.

SUMMARY

The technical problem to be solved by the present disclosure is to provide a GaN-based HBLED with reflecting layers and fabrication method so as to overcome the defects of the prior art. A first reflecting layer in a band-shaped distribution is added between the LED epitaxial layer and the P electrode (i.e., the peripheral area of the epitaxial layer), and a second reflecting layer is formed on the back of the substrate. The structure may also comprise a third reflecting layer formed between the current spreading layer and the P electrode, right at the bottom of the P electrode, thus effectively extracting the light emitted from the light-emitting layer, eliminating light absorption of the P electrode and improving light extraction efficiency. The first reflecting layer in a band-shaped distribution at the peripheral area of the epitaxial layer surface can extract part of light sideways, which is originally to be extracted upwards, thereby increasing opportunity of side light extraction of the LED. By controlling the ratio of lights (emitted from the light-emitting layer) extracted upwards and sideways, the light-emitting distribution evenness is adjusted and the uneven heat dissipation is improved.

To achieve the above object, the technical scheme disclosed is to firstly grow an epitaxial layer on front of the substrate and to form a first reflecting layer in a band-shaped distribution on the epitaxial layer before fabrication of the current spreading layer and the P and N electrodes. The last step is to fabricate a second reflecting layer on the back of the substrate. Before fabrication of the P and N electrodes, a third reflecting layer can be formed between the current spreading layer and the P electrode right at the bottom of the P electrode.

The fabrication in the present disclosure mainly comprises: 1) growing an epitaxial layer on the front of the substrate; 2) forming a first reflecting layer in a band-shaped distribution on the peripheral area of the epitaxial layer surface; 3) forming a current spreading layer on the first reflecting layer in a band-shaped distribution and the exposed epitaxial layer; 4) plating a third reflecting layer on the surface layer of the current spreading layer; 5) fabricating a P electrode and an N electrode on the third reflecting layer and the exposed N-type layer; and 6) forming a second reflecting layer on the back of the substrate, wherein, in step 2), bonding the edges of the first reflecting layer in a band-shaped distribution and the epitaxial layer; in step 4) locating the third reflecting layer at right bottom of the P electrode.

A GaN-based HBLED with dual reflecting layers, comprising a substrate with front and back sides; an epitaxial layer formed on the front surface of the substrate, comprising a P-type layer, a light-emitting area and an N-type layer from top-down; a current spreading layer formed on the P-type layer; a P electrode formed on the current spreading layer; a first reflecting layer located between the current spreading layer and the epitaxial layer at the peripheral area of the epitaxial layer in a band-shaped distribution distribution; and a second reflecting layer on the back of the substrate.

The GaN-based HBLED with reflecting layers can also comprise a third reflecting layer formed between the current spreading layer and the P electrode, right at the bottom of the P electrode.

The first reflecting layer locates at the peripheral area of the epitaxial layer and forms a closed annular.

The P electrode locates at the peripheral area of the current spreading layer. The first reflecting layer locates at the peripheral area of the epitaxial layer away from the P electrode.

The stripe width of the first reflecting layer is 5-30 μm.

The first reflecting layer accounts for 5%-30% of the light emitting area of the epitaxial layer.

The diameter of the third reflecting layer is 50-200 μm.

The first reflecting layer can be a DBR, a metal reflecting layer or an ODR.

The second reflecting layer can be a DBR, a metal reflecting layer or an ODR.

The third reflecting layer can be a DBR, a metal reflecting layer or an ODR.

The first and second reflecting layers are composed of alternating high refractive index and low reflective index material layers, wherein, the high refractive index layer is selected from TiO, $TiO_2$, $Ti_3O_5$, $Ti_2O_3$, $Ta_2O_5$, $ZrO_2$ or any of their combinations and the low reflective index layer is selected from $SiO_2$, $SiN_x$, $Al_2O_3$ or any of their combinations.

The first, second and third reflecting layers can be Al, Ag or Ni or any of their combinations.

The substrate can be sapphire ($Al_2O_3$) or silicon carbide (SiC).

The current spreading layer material can be Ni/Au alloy, Ni/ITO alloy, ITO, ZnO or In-mixed ZnO, Al-mixed ZnO, Ga-mixed ZnO or any of their combinations.

Compared with the conventional LEDs, the LEDs disclosed herein can have one or more of the following advantages: a first reflecting layer in a band-shaped distribution is arranged at the peripheral area of the LED epitaxial layer surface and extracts the light (originally to be extracted from upwards of the chip) sideways, thus increasing opportunity of sideways light extraction of LED, improving light-emitting distribution evenness and providing high brightness and even light-emitting source. The LEDs can be used in a light-emitting system such as displays and signage, which can include a plurality of such LEDs forming an array.

BRIEF DESCRIPTION OF THE DRAWINGS

FIG. 8 is a top view of the GaN-based HBLED disclosed in Embodiment 3.

DETAILED DESCRIPTION

Figure 1:
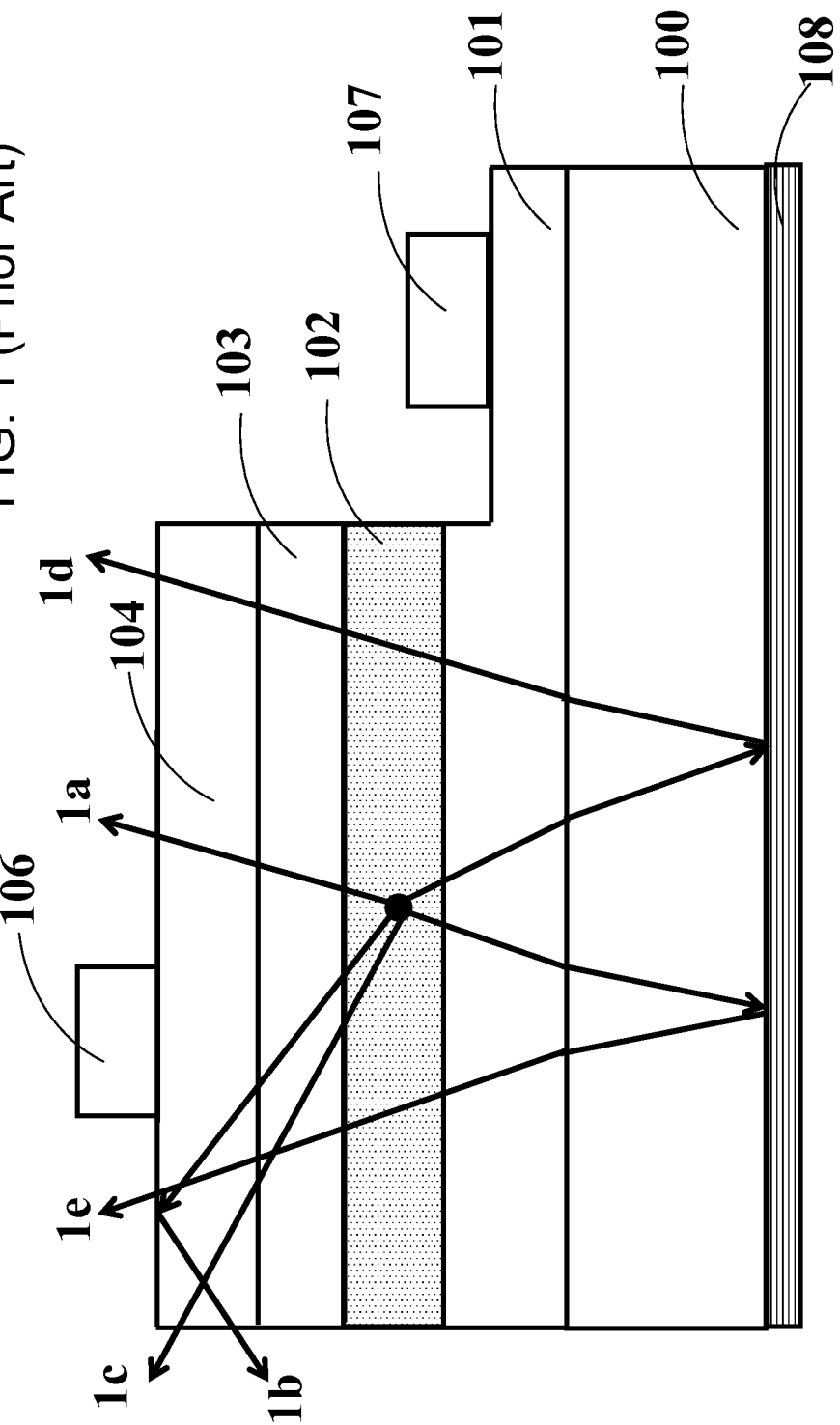
FIG. 1 is a diagram of a conventional LED.
Figure 2:
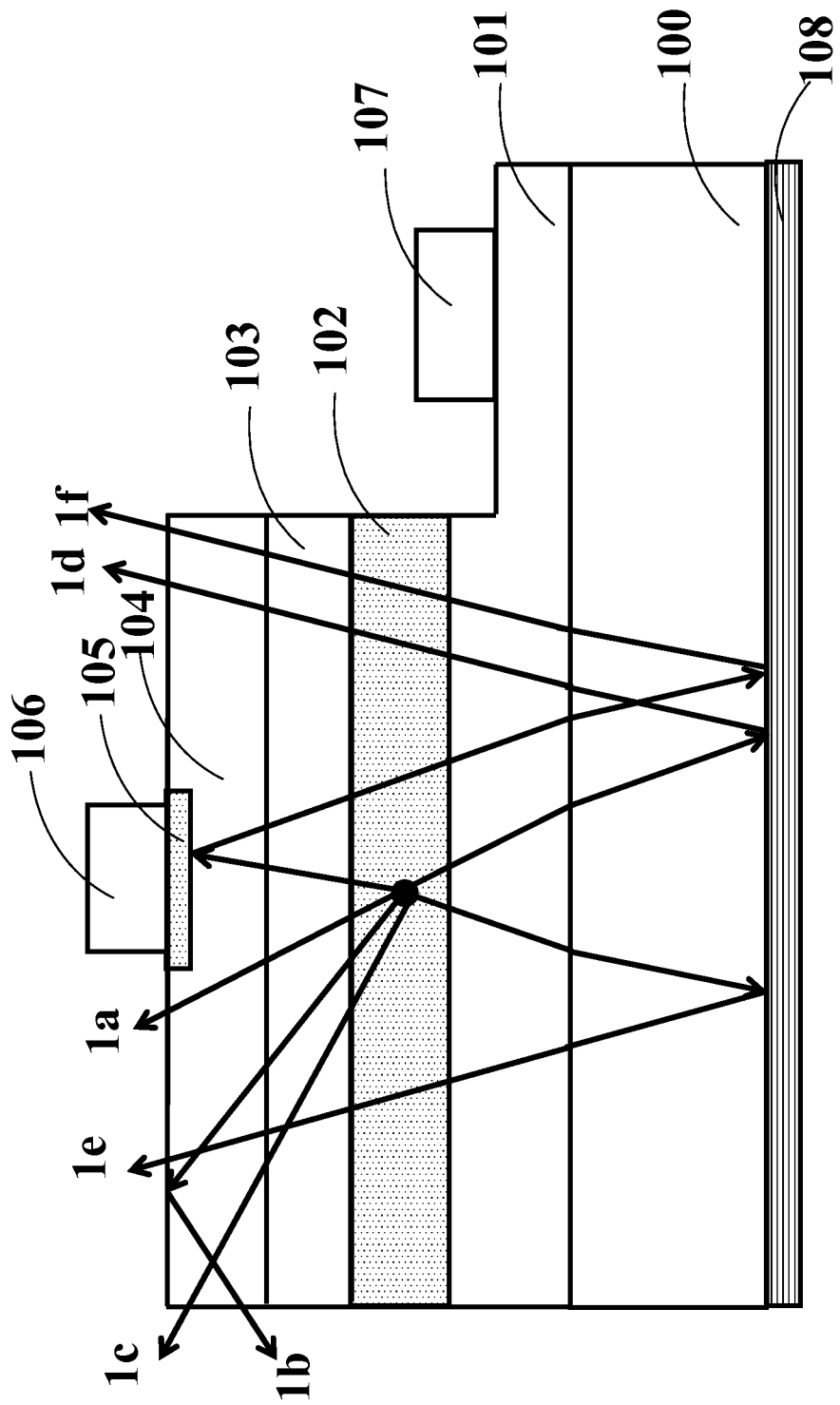
FIG. 2 is a diagram of an improved LED structure.

The embodiments of the present disclosure will be described in detail with reference to the accompanying drawings and examples, to help understand and practice the disclosed embodiments, regarding how to solve technical problems using technical approaches for achieving the technical effects. In specific device design and manufacture, the LED structures according to the present disclosure will be adjusted and changed in terms of structure, dimension and the material based on specific application fields and process.

The embodiments disclose a GaN-based HBLED with reflecting layers, comprising a substrate, an epitaxial layer, a current spreading layer, a reflecting structure, a P electrode and an N electrode.

More specifically, the substrate can be sapphire ($Al_2O_3$), silicon carbide (SiC) or silicon wafer (Si). Insulation material is applied for horizontal LED devices and conductive material for vertical LED devices.

The epitaxial layer can be formed on the substrate surface through epitaxial growth, comprising at least an N-type layer, a light-emitting layer and a P-type layer from bottom up, also comprising a buffer layer and an electron blocking layer. The material is GaN-based semiconductor.

The current spreading layer, formed on the P-type layer, can be Ni/Au alloy, Ni/ITO alloy, ITO, ZnO or In-mixed ZnO, Al-mixed ZnO, Ga-mixed ZnO or any of their combinations.

The P electrode is formed on the electrode extension layer and is used for provision of current injection for the light-emitting layer. The horizontal LED device may etch part of the P-type layer and the light-emitting layer and expose the N-type layer. The N electrode is formed on the exposed N-type layer surface. In the vertical LED device, the N electrode is on the back of the conductive substrate.

The reflecting structure comprises a first reflecting layer and a second reflecting layer, wherein, the first reflecting layer locates between the current spreading layer and the epitaxial layer and at the peripheral area of the epitaxial layer in a band (or stripe)-shaped distribution, either forming in a closed annular or a non-closed shape at the peripheral area away from the P electrode. More specifically, a first reflecting layer is formed on the p-type layer and locates between the p-type layer and the current spreading layer. It may be included in the current spreading layer or be implanted in the epitaxial layer. It can be a DBR, a metal reflecting layer or an ODR. The structure size and position parameters for the first reflecting layer can be adjusted and designed based on chip size and specific optical path. According to some embodiments, the stripe width of the first reflecting layer is 5-30 μm and the area accounts for 5%-30% of the light emitting area of the epitaxial layer. The second reflecting layer locates on the back of the substrate and can be a DBR, a metal reflecting layer or an ODR. A third reflecting layer can be arranged at the right bottom of the P electrode between the current spreading layer and the P electrode. The diameter is 50-200 μm. The third reflecting layer can be a DBR, a metal reflecting layer or an ODR. The reflecting layers in the reflecting structure can be made from Alternating high refractive index and low reflective index material layers. The high refractive index layer is selected from TiO, $TiO_2$, $Ti_3O_5$, $Ti_2O_3$, $Ta_2O_5$, $ZrO_2$ or any of their combinations. The low reflective index layer is selected from $SiO_2$, $SiN_x$, $Al_2O_3$ or any of their combinations. The reflecting layers in the reflecting structure can also be pure-metal reflecting layer like Al, Ag or Ni.

In the following, detailed descriptions will be given in combination with Embodiments 1-3 and FIGS. 3-8.

Embodiment 1

Figure 3:
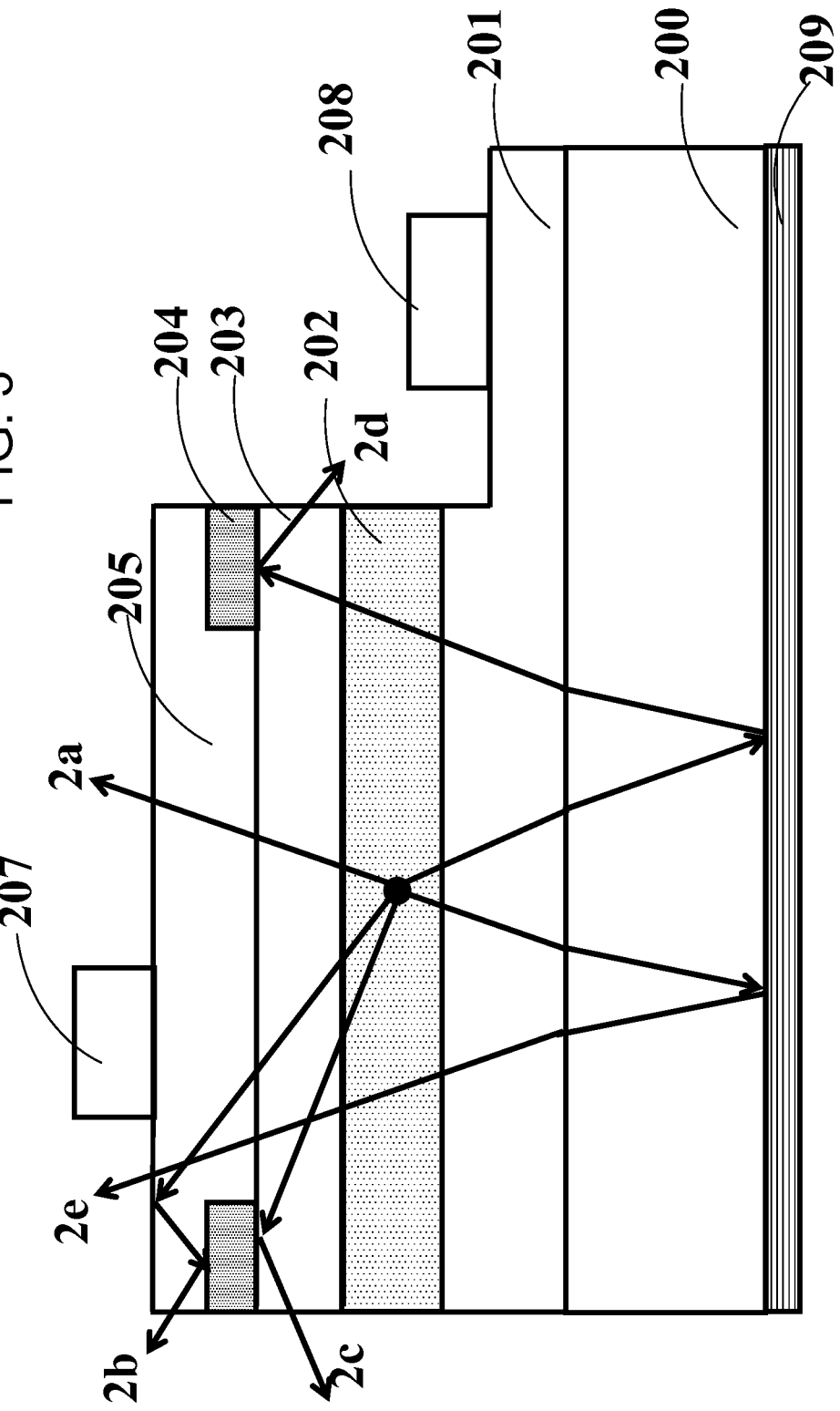
FIG. 3 is a cross-sectional view of the GaN-based HBLED disclosed in Embodiment 1.
Figure 4:
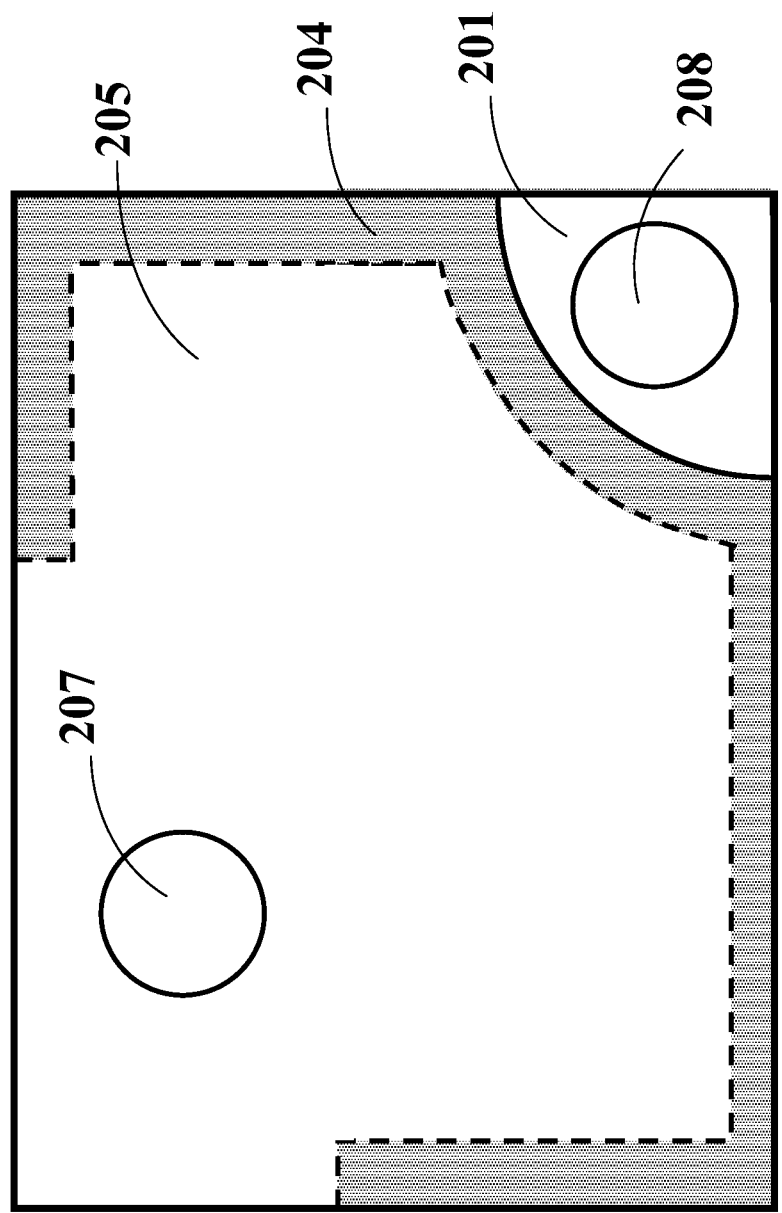
FIG. 4 is a top view of the GaN-based HBLED disclosed in Embodiment 1.

As shown in FIGS. 3-4, a GaN-based HBLED, comprising a sapphire substrate 200, an N-type layer 201, a light-emitting area 202, a P-type layer 203, a non-closed annular first reflecting layer 204, a current spreading layer 205, a P electrode 207, an N electrode 208 and a second reflecting layer 209.

More specifically, the LED structure has a sapphire substrate 200 at the bottom; an N-type layer 201, formed on the sapphire substrate 200; a light-emitting area 202, formed on the N-type layer 201; a P-type layer 203, formed on the light-emitting area 202; a first reflecting layer 204, selected as a DBR, formed on the P-type layer 203 and at the peripheral area of the P-type layer 203 away from the P electrode, wherein, the stripe width is 15 μm and the area accounts for about 20% of the light emitting area of the epitaxial layer; an ITO current spreading layer 205, formed on the first reflecting layer 204 and the exposed P-type layer 203 surface; a P electrode 207, formed on the current spreading layer 205; an N electrode 208, formed on the exposed N-type layer 201; a second reflecting layer 209, selected as an ODR, formed on the back of the sapphire substrate 200; wherein the DBR 204 comprises Alternating high refractive index $TiO_2$ material and low refractive index $SiO_2$ material.

The beneficial effects of the present embodiment are that: a non-closed annular DBR 204 on the peripheral area of the P-type layer 203 surface of the LED epitaxial layer, apart from extracting Lights 2a and 2e from the front of the chip and Lights 2b and 2c from the side of the chip, also extracts the light (originally to be extracted from upwards of the chip) sideways (as shown in Light 2d), thus increasing opportunity of sideways light extraction of LED, improving light-emitting distribution evenness and providing high brightness and even light-emitting source.

Embodiment 2

Figure 5:
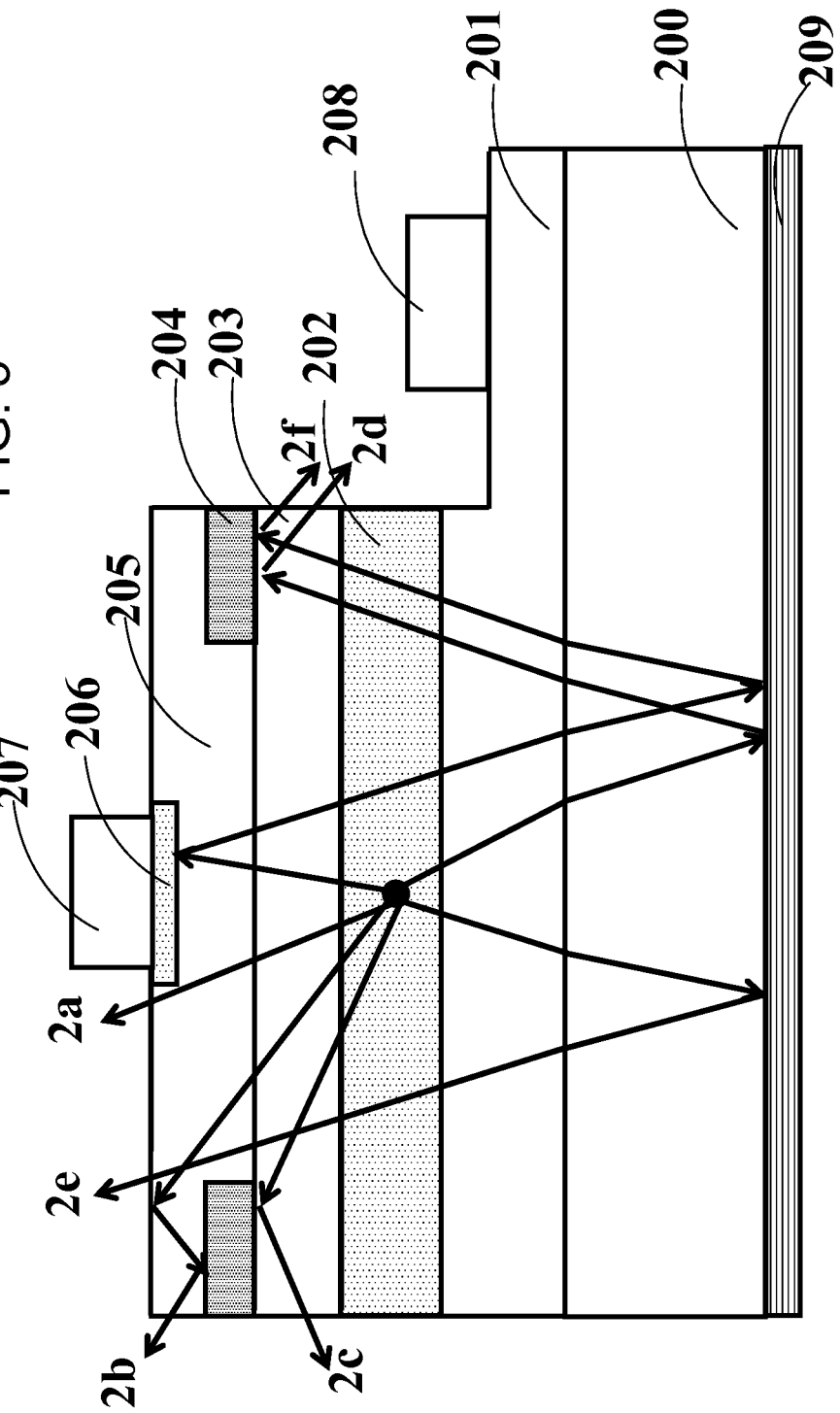
FIG. 5 is a cross-sectional view of the GaN-based HBLED disclosed in Embodiment 2.
Figure 6:
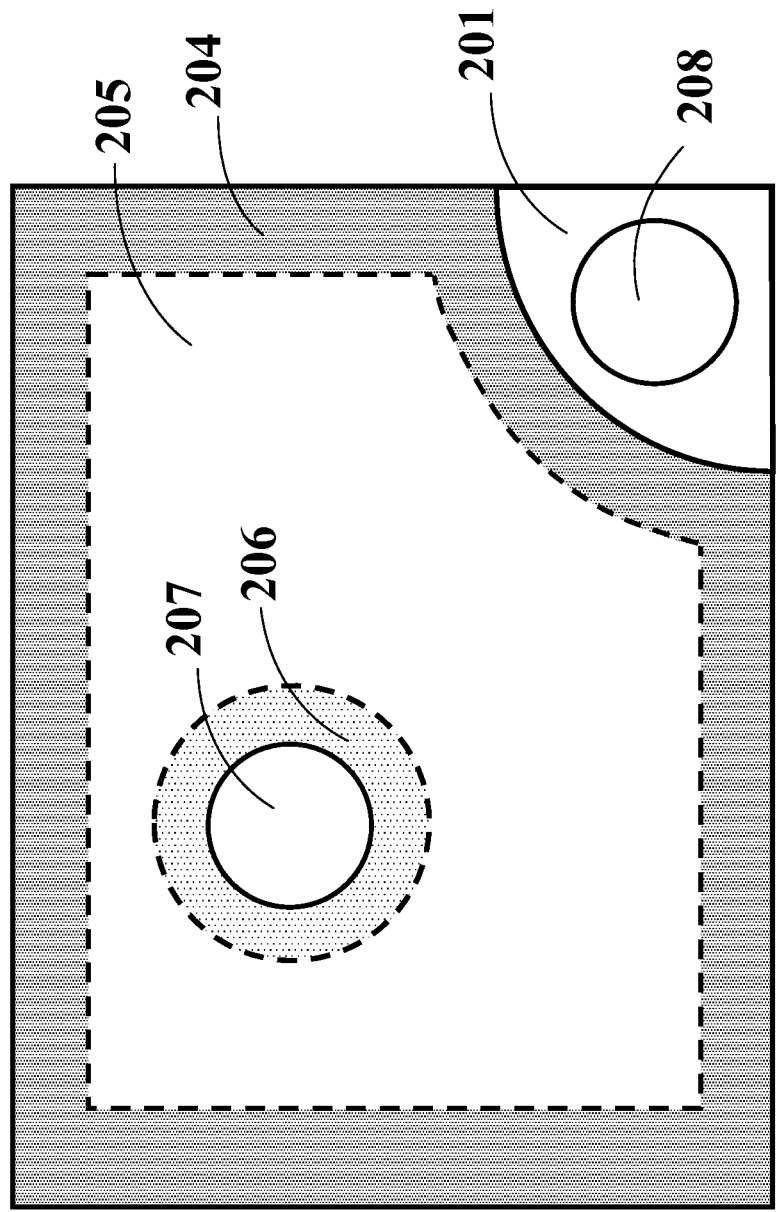
FIG. 6 is a top view of the GaN-based HBLED disclosed in Embodiment 2.
Figure 7:
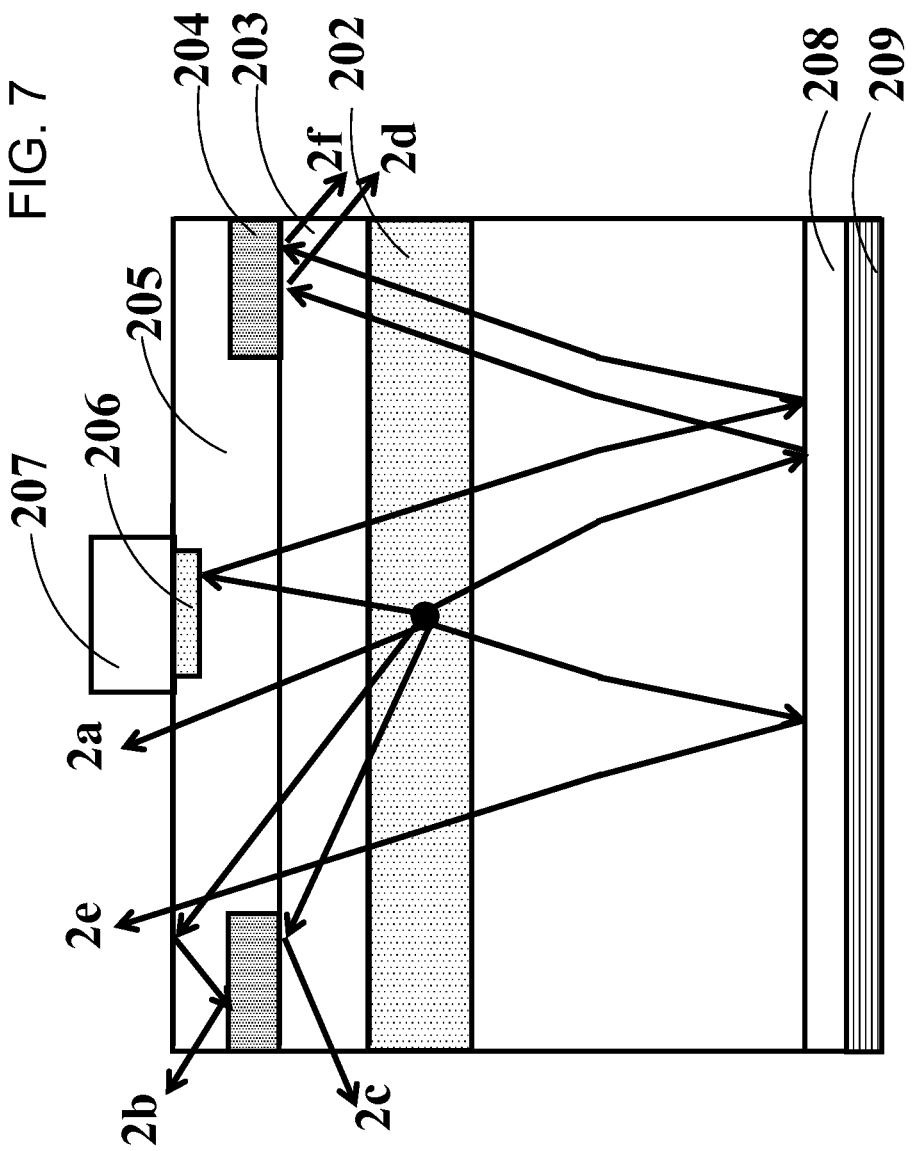
FIG. 7 is a cross-sectional view of the GaN-based HBLED disclosed in Embodiment 3.

As shown in FIGS. 5-6, a GaN-based HBLED, comprising a sapphire substrate 200, an N-type layer 201, a light-emitting area 202, a P-type layer 203, a closed annular first reflecting layer 204, a current spreading layer 205, a third reflecting layer 206, a P electrode 207, an N electrode 208 and a second reflecting layer 209.

More specifically, the bottom layer in the LED structure is a sapphire substrate 200; an N-type layer 201 is formed on the sapphire substrate 200; a light-emitting area 202 is formed on the N-type layer 201; and a P-type layer 203 is formed on the light-emitting area 202. A first reflecting layer 204, selected as a DBR, is formed on the P-type layer 203 and located at the peripheral area of the P-type layer 203 surface. The stripe width of the first reflecting layer is 20 µm and the area accounts for 25% of the light emitting area of the epitaxial layer. An ITO current spreading layer 205 is formed on the closed DBR 204 and the exposed P-type layer 203 surface. A third reflecting layer 206, selected as an Al reflecting layer, is formed on the ITO current spreading layer 205 surface, wherein, diameter of the third reflecting layer (90 µm) is larger than the P electrode diameter; a P electrode 207 is formed on the third reflecting layer 206; an N electrode 208 is formed on the exposed N-type layer 201; a second reflecting layer 209, selected as an Al metal reflecting layer, is formed on the back of the sapphire substrate 200. The DBR 204 comprises alternating high refractive index $TiO_2$ material and low refractive index $SiO_2$ material.

The beneficial effects of the present embodiment are that: a closed annular DBR 204 on the peripheral area of the surface of the P-type layer 203 of the LED epitaxial layer, apart from extracting Lights 2a and 2e from the front of the chip and Lights 2b and 2c from the side of the chip, also extracts the light (originally to be extracted from upwards of the chip) sideways, thus increasing opportunity of sideways light extraction of LED (as shown in Light 2d and 2f), improving light-emitting distribution evenness and providing high brightness and even light-emitting source.

It should be understood that in the above structure, the third reflecting layer 206 may be inside the current spreading layer or on the current spreading layer.

Embodiment 3

In comparison with Embodiment 2, the present embodiment discloses a vertical GaN-based HBLED with reflecting layers. In the present embodiment, Si serves as the substrate 200. The N electrode 208 forms on the back of the substrate and constitutes a vertical LED device. The third reflecting layer 206 is an ODR. The diameter is 70 µm, less than the P electrode diameter, for the convenient contact conduction of the P electrode and the current spreading layer 205.

Advantages of the reflecting layer structure disclosed herein may include one or more of: (1) the first reflecting layer can be in closed annular shape or in non-closed annular shape; and (2) the peripheral area of the a band-shaped (annular) reflecting layer overlaps with the peripheral area of the epitaxial layer surface. Through reasonable design and distribution of the a band-shaped (annular) reflecting layer, part of light (originally to be extracted from upwards of the chip) can be extracted sideways, thus improving light-emitting distribution evenness of the LED chip.

The invention claimed is:

1. A GaN-based LED, comprising:
a substrate with front and back sides;
an epitaxial layer formed over the front side of the substrate and including, from top down, a P-type layer, a light-emitting area, and an N-type layer;
a current spreading layer formed over the P-type layer;
a P electrode formed over the current spreading layer;
a first reflecting layer between the current spreading layer and the epitaxial layer, disposed at a peripheral area of the epitaxial layer in a band-shaped distribution, and configured to reflect a portion of light emitted upward from the light-emitting area toward at least two sides of the LED to increase light extraction sideways and thereby improve a light distribution evenness; and
a second reflecting layer over the back side the substrate.

2. The GaN-based LED of claim 1, further comprising a third reflecting layer between the current spreading layer and the P electrode, underneath the P electrode.

3. The GaN-based LED of claim 1, wherein the first reflecting layer has a closed annular shape.

4. The GaN-based LED of claim 1, wherein the P electrode is disposed at a peripheral area of the current spreading layer, and wherein the first reflecting layer is disposed away from the P electrode.

5. The GaN-based LED of claim 1, wherein a width of the first reflecting layer is 5-30 µm.

6. The GaN-based LED of claim 1, wherein the first reflecting layer has an area of 5%-30% of the light-emitting area of the epitaxial layer.

7. The GaN-based LED of claim 2, wherein a diameter of the third reflecting layer is 50-200 µm.

8. The GaN-based LED of claim 1, wherein the first reflecting layer comprises one of a DBR, a metal reflecting layer, or an ODR.

9. The GaN-based LED of claim 1, wherein the second reflecting layer comprises one of a DBR, a metal reflecting layer, or an ODR.

10. The GaN-based LED of claim 2, wherein the third reflecting layer comprises one of a DBR, a metal reflecting layer, or an ODR.

11. A light-emitting system comprising a plurality of GaN-based LEDs, each LED comprising:
a substrate with front and back sides;
an epitaxial layer formed over the front side of the substrate and including, from top down, a P-type layer, a light-emitting area, and an N-type layer;
a current spreading layer formed over the P-type layer;
a P electrode formed over the current spreading layer;
a first reflecting layer between the current spreading layer and the epitaxial layer, disposed at a peripheral area of the epitaxial layer in a band-shaped distribution, and configured to reflect a portion of light emitted upwards from the light-emitting area toward at least two sides of the LED to increase light extraction sideways and thereby improve a light distribution evenness; and
a second reflecting layer over the back side the substrate.

12. The system of claim 11, each LED further comprising a third reflecting layer between the current spreading layer and the P electrode, underneath the P electrode.

13. The system of claim 11, wherein the first reflecting layer has a closed annular shape.

14. The system of claim 11, wherein the P electrode is disposed at a peripheral area of the current spreading layer, and wherein the first reflecting layer is disposed away from the P electrode.

15. The system of claim 11, wherein a width of the first reflecting layer is 5-30 μm.

16. The system of claim 11, wherein the first reflecting layer has an area of 5%-30% of the light-emitting area of the epitaxial layer.

17. The system of claim 12, wherein a diameter of the third reflecting layer is 50-200 μm.

18. The system of claim 11, wherein the first reflecting layer comprises one of a DBR, a metal reflecting layer, or an ODR.

19. The system of claim 11, wherein the second reflecting layer comprises one of a DBR, a metal reflecting layer, or an ODR.

20. The system of claim 12, wherein the third reflecting layer comprises one of a DBR, a metal reflecting layer, or an ODR.

\* \* \* \* \*